(12) United States Patent
Miller et al.

(10) Patent No.: US 6,724,603 B2
(45) Date of Patent: Apr. 20, 2004

(54) ELECTROSTATIC DISCHARGE PROTECTION CIRCUITRY AND METHOD OF OPERATION

(75) Inventors: James W. Miller, Austin, TX (US); Geoffrey B. Hall, Austin, TX (US); Alexander Krasin, Moscow (RU); Michael Stockinger, Austin, TX (US); Matthew D Akers, Austin, TX (US); Vishnu G. Kamat, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 57 days.

(21) Appl. No.: 10/216,336

(22) Filed: Aug. 9, 2002

(65) Prior Publication Data

US 2004/0027742 A1 Feb. 12, 2004

(51) Int. Cl.[7] .............................. H02H 3/22; H02H 7/20
(52) U.S. Cl. ........................................... 361/111; 361/56
(58) Field of Search .............................. 361/111, 56, 54; 257/655, 363

(56) References Cited

U.S. PATENT DOCUMENTS

| | | |
|---|---|---|
| 5,034,845 A | 7/1991 | Murakami |
| 5,239,440 A | 8/1993 | Merrill |
| 5,287,241 A | 2/1994 | Puar |
| 5,311,391 A * | 5/1994 | Dungan et al. ................ 361/56 |
| 5,361,185 A | 11/1994 | Yu |
| 5,440,162 A | 8/1995 | Worley et al. |
| 5,515,232 A * | 5/1996 | Fukazawa et al. ........... 361/111 |
| 5,559,659 A | 9/1996 | Strauss |
| 5,610,790 A | 3/1997 | Staab et al. |

(List continued on next page.)

FOREIGN PATENT DOCUMENTS

| | | |
|---|---|---|
| EP | 0 026 056 A1 | 4/1981 |
| GB | 2 286 287 A | 8/1995 |

OTHER PUBLICATIONS

Cynthia A. Torres et al.; "Modular, Portable, and Easily Simulated ESD Protection Networks for Advanced CMOS Technologies;" EOS/ESD Symposium 2001; Sep. 2001; 14 pages.

S. Dabral et al.; "Core Clamps For Low Voltage Technologies;" EOS/ESD Symposium 94; pp. 3.6.1–3.6.9.

Richard Merrill et al.; "ESD Design Methodology;" EOS/ESD Symposium 93; pp. 5B.5.1–5B.5.5.

E. R. Worley et al.; "Sub–Micron Chip ESD Protection Schemes Which Avoid Avalanching Junctions;" EOS/ESD Symposium 95; pp. 1.2.1–1.2.8.

Warren R. Anderson et al.; "Cross–Referenced ESD Protection for Power Supplies," EOS/ESD Symposium 98; pp. 2A.5.1–2A.5.10.

Primary Examiner—Stephen W. Jackson
Assistant Examiner—Zeev Kitov
(74) Attorney, Agent, or Firm—Robert L. King; Kim-Marie Vo

(57) ABSTRACT

An Electrostatic Discharge (ESD) protection circuit (9) includes a plurality of I/O and power supply pad cells (22, 40) that comprise external pads (31, 41) and circuitry requiring ESD protection. The protection circuit includes an array of shunting devices (36, 46) coupled in parallel between an ESD bus (14) and a VSS bus (18) and distributed among the plurality of pad cells. One or more trigger circuits (50) control the shunting devices. ESD events are coupled from any stressed pad onto two separate buses: the ESD bus which routes the high ESD currents to the positive current electrodes of the multiple shunting devices, and a Boost bus (12) which controls the trigger circuits. During an ESD event, the trigger circuits drive the control electrodes of the shunting devices to a voltage level greater than possible with prior art circuits, thereby reducing the on-resistance of the shunting devices.

16 Claims, 5 Drawing Sheets

U.S. PATENT DOCUMENTS

| | | |
|---|---|---|
| 5,654,862 A | 8/1997 | Worley et al. |
| 5,721,656 A | 2/1998 | Wu et al. |
| 5,751,051 A | 5/1998 | Hayano |
| 5,825,600 A | 10/1998 | Watt |
| 5,946,177 A * | 8/1999 | Miller et al. .................. 361/56 |
| 5,991,134 A | 11/1999 | Tan et al. |
| 6,002,156 A | 12/1999 | Lin |
| 6,222,710 B1 | 4/2001 | Yamaguchi |
| 6,385,021 B1 | 5/2002 | Takeda et al. |

* cited by examiner

*FIG. 1* –PRIOR ART–

ELECTROSTATIC DISCHARGE PROTECTION CIRCUITRY AND METHOD OF OPERATION

FIELD OF THE INVENTION

This invention relates generally to semiconductor circuits providing electrostatic discharge (ESD) protection, and more specifically, to a distributed ESD protection scheme.

BACKGROUND OF THE INVENTION

An integrated circuit may be subject to an Electrostatic Discharge (ESD) event in the manufacturing process, during assembly and testing, or in the ultimate system application. In conventional integrated circuit (IC) ESD protection schemes, special clamp circuits are often used to shunt ESD current between the power supply rails and thereby protect internal elements from damage. A type of ESD clamp circuit, known as an active Metal Oxide Semiconductor Field Effect Transistor (MOSFET) clamp circuit, typically consists of three functional elements; a Resistor-Capacitor (RC) transient detector circuit, an intermediate buffer circuit, and a large MOSFET transistor, which serves as the primary ESD current shunting device. Active MOSFET clamp circuits may be employed in networks distributed along the IC power buses to provide robust and consistent ESD protection for multiple Input/Output (I/O) pads. Multiple embodiments of such networks are shown in U.S. Pat. No. 6,385,021 entitled "Electrostatic Discharge (ESD) Protection Circuit" and assigned to the assignee hereof.

FIG. 1 illustrates one such distributed ESD network 1000 in an IC to protect multiple I/O circuits 1030–1032. While only three I/O circuits are shown in this schematic, in a typical implementation the distributed network would encompass a much larger bank of I/O circuits. I/O circuit 1032 includes an external connection pad 1050 that is coupled between the $V_{SS}$ bus 1042 and the $V_{DD}$ bus 1044. A diode 1052 has an anode connected to the $V_{SS}$ bus 1042 and a cathode connected to the I/O pad 1050. A diode 1053 has an anode connected to the I/O pad and a cathode connected to the $V_{DD}$ bus 1044. In one example of ESD network 1000, the diode 1053 is formed as a P+ active in NWELL diode and the diode 1052 is formed as a N+ active in P-substrate diode. A clamp N-channel MOSFET (NMOSFET) 1054 is connected between the $V_{SS}$ bus 1042 and the $V_{DD}$ bus 1044. The gate of clamp NMOSFET 1054 is connected to a Trigger bus 1046. Not shown in I/O circuit 1032 is the circuitry desired to be protected, such as for example P-channel MOSFET (PMOSFET) and N-channel (NMOSFET) output drivers, and other circuit components typically required for I/O operation. I/O circuits 1030 and 1031, each identical to I/O circuit 1032, are also shown in FIG. 1. A remote trigger circuit 1040 contains an RC transient detector circuit 1063 and a buffer circuit 1064. RC transient detector circuit 1063 includes a capacitor 1061 connected between the $V_{SS}$ bus 1042 and a node 1065, and a resistor 1062 connected between this same node and the $V_{DD}$ bus 1044. Buffer circuit 1064 may, for example, contain a series of three series-connected CMOS inverter stages, not shown, between the input at node 1065, and the output to the Trigger bus 1046 at node 1066. Each inverter stage typically has a PMOSFET with its source connected to the $V_{DD}$ bus 1044 and a NMOSFET with its source connected to the $V_{SS}$ bus 1042.

Three buses are shown in FIG. 1, a $V_{SS}$ bus 1042, a $V_{DD}$ bus 1044, and a Trigger bus 1046. These buses are typically routed around all or part of the IC periphery, to serve the I/O circuits normally placed in this region. A series of incremental bus resistors, each labeled R1, is shown on the $V_{DD}$ bus 1044 between two adjacent I/O circuits, or an I/O circuit and an adjacent remote trigger circuit. Each resistor represents the distributed parasitic metal resistance for that segment of the $V_{DD}$ bus 1044 between two adjacent circuits. The bus length from the physical center of one such circuit to the physical center of the adjacent circuit may be used in making these resistance calculations. While these resistors are all shown with the label R1, it should be understood that these resistance values often vary considerably in magnitude as the physical spacing between I/O circuits, or between an I/O circuit and a remote trigger circuit, is varied. Similarly variable incremental bus resistors, each labeled R2, are shown on the Trigger bus 1046. Incremental bus resistors may also be shown on the $V_{SS}$ bus 1042, but are not included in FIG. 1 in order to clarify the schematic. Note that in a typical IC application, additional I/O circuits and additional incremental bus resistors (R1, R2) may be added to the ESD protection network, as indicated by the dots placed to the left and right of the elements shown in FIG. 1.

Integrated circuits are often most susceptible to damage during positive ESD events coupled onto an I/O pad referenced to grounded $V_{SS}$. The primary response of ESD network 1000 to this event applied to I/O pad 1050 in FIG. 1 is as follows. Diode 1053 forward biases as the I/O pad voltage very quickly ramps well above 0.7V. This then produces a rapid voltage increase over time (dV/dt), or voltage slew rate on the $V_{DD}$ bus 1044. The RC transient detector circuit 1063 is one type of voltage transient detector circuit or voltage slew rate sensor circuit. In response to the very rapid ESD-induced dV/dt on the $V_{DD}$ Bus 1044, transient detector circuit 1063 initially holds node 1065 well below $V_{DD}$. The buffer circuit 1064 senses this input low and outputs an inverted and amplified signal that drives the Trigger bus 1046 to $V_{DD}$. This turns on the multiple clamp NMOSFETs 1054 distributed in each I/O circuit. Note that since the remote trigger circuit 1040 is driving only gates of the distributed clamp NMOSFETs 1054, the resulting current routed onto the Trigger bus 1046 is very small. Once turned on, this cumulative network of clamp NMOSFETs acts as a low resistance shunt between the $V_{DD}$ bus 1044 and the $V_{SS}$ bus 1042. The clamp NMOSFETs will remain conductive for a period of time that is determined by the RC time constant of the transient detector circuit 1063. This time constant should be set to exceed the typical duration of an ESD event (200–500 nanoseconds), while short enough to avoid false triggering of the clamp NMOSFETs during normal ramp up of the $V_{DD}$ bus. The $V_{DD}$ ramp up during normal IC operation typically requires 1–5 microseconds.

As described above, transient detector circuits respond to an applied ESD event by sensing a rapid voltage increase over time (dV/dt) on the $V_{DD}$ bus. It should be pointed out that another type of ESD detector circuit, a voltage threshold detector circuit, exists in the prior art. Voltage threshold detector circuits respond to an applied ESD event by sensing that a predetermined voltage threshold on the $V_{DD}$ bus has been exceeded. If this threshold is not exceeded, then the clamp NMOSFETs remain nonconductive.

During the ESD event described above, the I/O pad 1050 voltage rises to a peak level set by the sum of the voltage drops as the peak current of the applied ESD event flows through the intended dissipation paths. In the industry standard 200V Machine Model ESD event, the peak current forced through the IC may reach about 3.8A. In order to protect fragile elements in I/O circuit 1032, the ESD clamp network must typically prevent the I/O pad 1050 voltage from rising above a critical voltage failure threshold, which typically varies in a range from 6–10V, depending on process technology and output buffer configuration. Assuming, for example, an 8.0V failure threshold for the I/O circuit and a 3.8A peak ESD current, the net resistance through the entire dissipation path may not exceed about 2.1 ohms. Such an ESD path requires large active devices and robust interconnections between these devices.

U.S. Pat. No. 6,385,021, from which FIG. 1 is based, teaches the benefit of distributing small clamp NMOSFETs 1054 in each of the I/O circuits, as opposed to less frequent placement of larger clamp NMOSFETs along the power supply buses. This approach minimizes the impact of $V_{DD}$ bus resistance on ESD performance. When any I/O pad experiences a positive ESD event referenced to grounded $V_{SS}$, the individual clamp NMOSFETs 1054, distributed in each I/O circuit, turn on in parallel. However, due to the resistance on the $V_{DD}$ bus, only the clamp NMOSFETs in the vicinity of the stressed pad, in both directions along the bus, tend to shunt the majority of the ESD current. The cumulative effect of the many individual small clamp NMOSFETs allows multiple devices to harmlessly dissipate very large ESD currents. In networks with much less frequent placement of large clamp NMOSFETs, I/O pads placed most distant from these clamps suffer reduced ESD performance due to increased current-times-resistance (IR) voltage drop from the stressed I/O pad to the large clamp NMOSFETs. Note that even in the distributed small clamp NMOSFET networks as illustrated in FIG. 1, large clamp NMOSFETs are still needed at any point where the $V_{DD}$ bus is broken or terminated, to adequately protect I/O pads near the end of that $V_{DD}$ bus segment. Without this large clamp NMOSFET, a stressed I/O pad at the end of a VDD bus segment will only be able to access clamp NMOSFETs in one direction along the VDD bus. This will translate into significantly reduced ESD performance. In a preferred configuration, the $V_{DD}$ bus forms a continuous ring around the IC so that the $V_{DD}$ bus is not terminated. With this configuration, the network of small clamp NMOSFETs in the I/O circuits can provide complete ESD protection.

U.S. Pat. No. 6,385,021 also teaches the benefit of placing all or part of the rail clamp trigger circuitry in a location remote from the I/O circuits, driving the Trigger bus 1046 which gates each of the clamp NMOSFETs 1054 in a bank of I/O circuits. In many respects, this is preferable to the alternate approach of placing separate trigger circuits in each I/O circuit, to drive only the clamp NMOSFET located in that individual I/O circuit. This is because, in many chip designs, the I/O circuit is the most constrained portion of the IC periphery in terms of substrate or physical layout area. Reducing layout area in the I/O circuit often translates directly into smaller IC die size. RC transient detector circuits typically occupy a considerable layout area. Therefore it is more space efficient to share a single RC transient detector circuit 1063 among multiple clamp NMOSFETs in a bank of I/O circuits. The sizes of elements in buffer circuit 1064, on the other hand, are typically scaled depending on the total channel width of the clamp NMOSFETs that trigger circuit must drive. As taught in U.S. Pat. No. 6,385,021, elements of buffer circuit 1064 may be conveniently placed either in remote trigger circuit 40, in each individual I/O circuit 1032, or divided into portions and placed partly in the remote trigger circuit and partly in each I/O circuit.

It turns out that there are some limitations with the resulting ESD network, when placing the full buffer circuit 1064 in the remote trigger circuit 1040, as shown in FIG. 1.

One limitation with this approach is that the maximum distance between any I/O pad and its closest remote trigger circuit 1040 is limited, due primarily to IR voltage drops along the $V_{DD}$ bus from a stressed I/O pad to the remote trigger circuit. This limitation can be best demonstrated by simulating an ESD event on the network with standard circuit simulation tools and analyzing the resulting nodal voltages. Assume the network of FIG. 1 is part of a large bank of I/O circuits and incremental bus resistors. Consider the case where I/O pad 1050 experiences a positive 3.8A peak current ESD event referenced to grounded $V_{SS}$. Assume that the sizes of diode 1053 and clamp NMOSFET 1054 in each I/O circuit, and the magnitude of resistor R1 on the $V_{DD}$ bus, are adjusted so that the simulated voltage on I/O pad 1050 rises to a peak of 8.0V during this ESD event. At the peak ESD current level, the voltage drops across the diode 1053 and the parasitic interconnect resistances (not shown in FIG. 1) from this diode to the I/O pad and to the $V_{DD}$ bus typically sum to about 3.0V. Therefore the peak voltage on the $V_{DD}$ bus local to the stressed I/O pad is about 5.0 volts. ESD current will be routed along the $V_{DD}$ bus in both directions away from the stressed pad with the majority of the current shunted through the distributed rail clamp NMOSFETs 1054 within 1–2 ohms of $V_{DD}$ bus resistance. Note that due to this current flow, the peak $V_{DD}$ bus voltage is found local to the stressed I/O pad, and drops off in both directions away from the stressed pad. In this example simulation, the peak $V_{DD}$ bus voltages local to I/O circuits 1031, 1030, and remote trigger circuit 1040 are 4.7V, 4.5V, and 4.3V, respectively. Therefore the drain terminals of the distributed clamp NMOSFETs will be biased to different voltage levels depending on the proximity to the stressed I/O pad. However, the gate terminals of the distributed clamp NMOSFETs will be biased to the same voltage level, since they are all driven by the remote trigger circuit 1040 via the Trigger bus 1046. It is important to note that the voltage level of the Trigger bus will be dependent on the proximity of the remote trigger circuit to the stressed I/O pad. When activated during an ESD event, the remote trigger circuit drives the Trigger bus to a voltage level equal to the $V_{DD}$ bus potential local to that trigger circuit, in this case 4.3V. Therefore, clamp NMOSFETs closer to the stressed I/O pad than the remote trigger circuit will have a gate-to-source voltage (Vgs) less than the drain-to-source voltage (Vds), while clamp NMOSFETs more distant from the stressed I/O pad than the remote trigger circuit will have Vgs>Vds. Clearly, when the stressed I/O pad is located greater distances away from the remote trigger circuit than in the case described above, the IR drop along the $V_{DD}$ bus leads to further reductions in the resulting voltage level of the Trigger bus. It is very important to note that the voltage level on the Trigger bus is critical to ESD network performance. The drain-to-source on-resistance of the clamp NMOSFETs is approximately inversely proportional to Vgs, under these bias conditions. Therefore I/O pads most distant from remote trigger circuits will suffer the worst ESD performance.

Another limitation with the ESD protection circuit described in FIG. 1 is that the Trigger bus 1046 is subject to having voltage contention issues when there are multiple remote trigger circuits 1040 placed in parallel along the $V_{DD}$ bus 1044. Two trigger circuits located different distances from a stressed I/O pad would each attempt to drive the Trigger bus to different voltage levels. This could cause serious bus voltage contention problems. One solution to address the voltage contention issues is to segment the $V_{DD}$ bus and place only one remote trigger circuit 1040 per $V_{DD}$ bus segment. Therefore, the maximum length of a $V_{DD}$ bus segment is limited, both to minimize IR drop from a stressed I/O pad to a remote trigger circuit, and to a length which may be served by a single remote trigger circuit. In IC designs it may be very difficult to partition the $V_{DD}$ bus into such small segments. Thus there is a need for a new distributed rail clamp network with fewer limitations on the maximum length of the protected $V_{DD}$ bus.

The distributed rail clamp network described in FIG. 1 contains a plurality of individual, discrete, rail clamp NMOSFETs placed in each I/O circuit. This scheme can be a limitation in designs where the physical spacing between I/O circuits is large or varies considerably around the periphery of the IC. For example, many ICs utilize I/O circuits of a fixed physical height and width, taken from a standard cell design library. However, the spacing or gap between I/O circuits in a given IC can vary depending on the number of I/Os required and the physical IC core size. Therefore, in many IC designs, there are significant gaps between I/O circuits. In addition, it is common to increase the spacing between I/O circuits near the IC corners, to accommodate radial bond wire sweeps in the package. There is also typically a large gap between I/O circuits as the metal buses are routed around the IC corners.

From a distributed ESD network design point of view, any gap between I/O circuits, or any variability in gaps between I/O circuits has a negative impact on ESD performance. For example, an I/O pad in the center of a bank of widely spaced I/O circuits would suffer decreased ESD performance to $V_{SS}$ as compared to an I/O pad in a bank with physically abutted I/O circuits. This is due to the fact that, in a network of identically sized small rail clamp NMOSFETs distributed along a resistive power bus, the I/O pad ESD performance is very sensitive to varying incremental bus resistances R1 between the clamp NMOSFETs. One approach taught in U.S. Pat. No. 6,385,021 to minimize the impact of this problem, is to augment the clamp NMOSFETs in the I/O circuits with additional clamp NMOSFETs placed in spacer cells between I/O circuits. While this approach is effective at minimizing the worst case incremental $V_{DD}$ bus resistance R1 between clamp NMOSFETs, it typically requires that a large number of unique spacer cells be designed and placed for each different spacing between I/O circuits. However, since it is preferred that ESD protection networks be constructed with a minimum number of simple, modular, and reusable ESD elements, this approach is not ideal. Therefore, when sizing clamp NMOSFETs in these distributed networks, the designer often simply assumes a single R1 value for incremental bus resistors between all I/O circuits based on the worst case actual pad to pad spacing in the IC. This worst-case spacing is often twice the minimum pad-to-pad spacing measured if all the I/O circuits were abutted. A disadvantage of this approach is that the resulting required clamp NMOSFET channel width is then about twice the width that would have been required if all the I/O circuits were indeed abutted. For these reasons, there is a need for a new ESD network scheme which would utilize a minimum number of unique ESD elements, yet which would allow for minimum rail clamp NMOSFET channel widths in the region of each I/O circuit, and minimum variability in ESD performance from one I/O pad to the next, while allowing the maximum flexibility to place I/O circuits around the IC periphery with arbitrary spacing.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

In known distributed rail clamp ESD protection circuits, the control electrodes of the multiple shunting devices are often biased at a voltage less than the voltage applied to the positive current electrode. It is a goal of the present invention to implement an ESD protection circuit such that the voltage applied to the control electrodes of the shunting devices is greater than the voltage on the positive current electrode. This reduces the on-resistance of each shunting device, thereby improving the distributed rail clamp network performance, and reducing the layout area required to implement robust ESD protection circuits.

One embodiment of the present invention provides an ESD protection circuit where an array of shunting devices are coupled in parallel between an ESD bus and a $V_{SS}$ bus and distributed among a plurality of I/O and power supply pads to be protected. One or more trigger circuits, which may be placed in locations remote from these pads, are utilized for controlling the individual shunting devices both during an ESD event, and during normal circuit operation. ESD events may be coupled from any stressed pad onto two separate buses; the ESD bus which routes the high ESD currents from the pad to the positive current electrodes of the multiple shunting devices, and a Boost bus which controls the trigger circuits. Since the trigger circuits draw very little current when enabled during an ESD event, there is almost no IR voltage drop along the Boost bus between any stressed pad and the trigger circuits. Therefore the trigger circuits are able to drive the control electrodes of the multiple shunting devices to a voltage level generally greater than the peak voltage level on the ESD bus.

In one embodiment, the ESD bus and the Boost bus serve as separate positive power supply buses that connect to power supplies external to the IC. Likewise, the $V_{SS}$ bus serves as a grounded power supply bus that also connects to a power supply external to the IC. In alternate embodiments, any or all of these three buses may not directly connect to an external power supply. The $V_{SS}$ bus may also be coupled to the silicon substrate to allow the substrate to conduct in parallel with the $V_{SS}$ bus metal.

Figure 2:
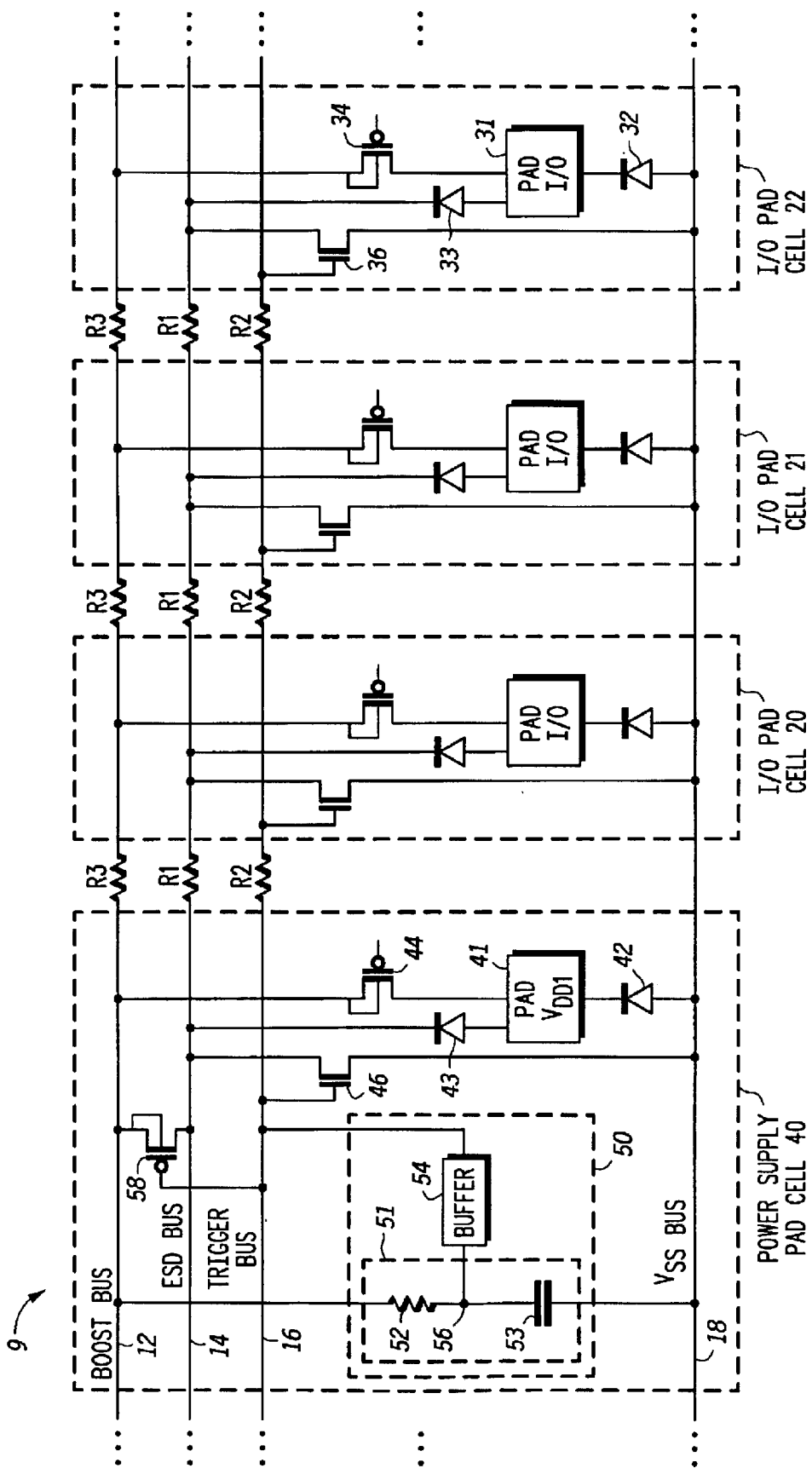
FIG. 2 illustrates in schematic form a distributed and boosted ESD protection network in accordance with the present invention.

FIG. 2 illustrates one embodiment of the present invention, where an ESD protection network 9 is provided within an integrated circuit. The ESD protection network 9 includes a variety of circuit portions including I/O pad cells 20–22, and a power supply pad cell 40. Each pad cell may be described in both a schematic sense, as shown in FIG. 2, and in a physical layout sense, occupying a specific area in the IC periphery. Each of these pad cells is coupled to a Boost bus 12, an ESD bus 14, a Trigger bus 16 and a $V_{SS}$ bus 18, which are also included in the ESD protection network 9. A series of incremental bus resistors R1 is shown on the ESD bus 14 between each of the I/O and power supply pad cells. A similar series of incremental bus resistors R2 and R3 are shown on the Trigger bus 16 and the Boost bus 12, respectively. Each resistor (R1, R2, and R3) represents the effective distributed parasitic metal resistance for that segment of the corresponding bus between two adjacent pad cells. The bus length from the physical center of one such pad cell to the physical center of the adjacent pad cell may, for example, be used in making these resistance calculations. While the incremental bus resistors along a bus are all shown with a single label, for example R1, it should be understood that their resistance values often vary considerably in magnitude as the physical spacing between pad cells is varied around the IC periphery. Incremental bus resistors may also be shown on the $V_{SS}$ bus, but are not included in FIG. 2 in order to clarify the schematic. It should be understood that the incremental bus resistors described above are not desirable from an ESD circuit design point of view. They are an unavoidable consequence of the limited area on any integrated circuit in which to route the bus metal. The Boost bus 12, ESD bus 14, Trigger bus 16 and $V_{SS}$ bus 18 may extend along the periphery of the IC expanding the ESD protection network 9 as shown by the dots in FIG. 2, to include additional pad cells and incremental bus resistors (not shown), which may be provided along the periphery of the chip. While a bank of only four pad cells is shown in FIG. 2, it is assumed that smaller or larger banks may be implemented. In a preferred form, the four buses form a complete ring around the IC periphery, with all the I/O and power supply pads on the IC protected within ESD protection network 9. If the ESD bus 14 is broken at any point, then as described earlier, large NMOSFET clamps (not shown in FIG. 2) must be placed at or near both ends of the ESD bus segment to properly protect I/O pads placed near the ends of the segment.

I/O pad cell 22 in FIG. 2 includes an external connection pad 31 that is coupled between the Boost bus 12, the ESD bus 14, and the $V_{SS}$ bus 18. A diode 32 has an anode terminal connected to the $V_{SS}$ bus 18 and a cathode terminal connected to the I/O pad 31. A diode 33 has an anode terminal connected to the I/O pad 31 and a cathode terminal connected to the ESD bus 14. A P-channel or p-type transistor, PMOSFET 34, has a first current electrode or a drain connected to the I/O pad 31 and a second current electrode or a source connected to the Boost bus 12. The control electrode or gate of PMOSFET 34 is coupled to a control signal (not shown) that will be described below in connection with FIG. 3. However, during a positive ESD event applied to I/O pad 31, this control signal is pulled to near $V_{SS}$, enabling low resistance drain-to-source conduction through PMOSFET 34. Also contained within I/O pad cell 22 is an N-channel or n-type transistor, clamp NMOSFET 36, which has a source that is connected to the $V_{SS}$ bus 18, and a drain connected to the ESD bus 14. The gate of clamp NMOSFET 36 is connected to the Trigger bus 16. I/O pad cells 20 and 21 are similar to I/O pad cell 22. In this embodiment, I/O pad cells 20 and 21 include the same circuitry as found in I/O pad cell 22, as shown in FIG. 2. Clamp NMOSFET 36 provides a direct current path between the ESD bus 14 and the $V_{SS}$ bus 18, during an ESD event. Note that the individual clamps, such as clamp NMOSFET 36, contained within each of the I/O pad cells are connected in parallel to provide distributed ESD protection independent of which I/O pad receives the ESD event. Not shown in I/O pad cell 22, is the circuitry to be protected, such as the PMOSFET and NMOSFET output drivers, the pre-driver circuitry for these output drivers, the input circuitry, and other circuit components required for normal I/O operation.

Power supply pad cell 40 in FIG. 2 includes an external connection pad 41 that is coupled to a positive power supply bus $V_{DD1}$ (not shown), and coupled between the Boost bus 12, the ESD bus 14, and the $V_{SS}$ bus 18. A diode 42, a diode 43, a PMOSFET 44, and a clamp NMOSFET 46 are shown in power supply pad cell 40 and they should be assumed identical to the analogous elements in I/O pad cell 22. Therefore, in this embodiment, the power supply pad $V_{DD1}$ 41 is coupled to, and protected by, the ESD protection network 9 just like an I/O pad. Alternate embodiments may utilize different approaches for power supply pad ESD protection, while retaining the I/O pad protection approach illustrated in FIG. 2.

The clamp NMOSFETs 36 contained within I/O pad cells 20–22, and clamp NMOSFET 46 contained within power supply pad cell 40 form a plurality of shunting circuits. Each are controlled by a trigger circuit 50 in power supply pad cell 40, via the Trigger bus 16. Trigger circuit 50 has a first terminal connected to the boost bus 12, a second terminal connected to the trigger bus 16 and a third terminal connected to the $V_{SS}$ bus 18. The trigger circuit 50 comprises a RC transient detector circuit 51, including a resistor 52 and a capacitor 53, and a buffer circuit 54. In one embodiment, resistor 52 and capacitor 53 may each be formed from an NMOSFET or a PMOSFET. A first terminal of resistor 52 is connected to the Boost bus 12. An input of buffer circuit 54 is connected to a second terminal of resistor 52 and to a first terminal of capacitor 53. An output of buffer circuit 54 is connected to the Trigger bus 16. A second terminal of capacitor 53 is connected to the $V_{SS}$ bus 18. In this embodiment, buffer circuit 54 comprises an odd number of series-connected CMOS inverter stages (not shown) between the input and the output nodes. Each inverter stage contains a PMOSFET with a source connected to the Boost bus 12 and a NMOSFET with source coupled to the $V_{SS}$ bus. It is important to note that, when enabled during an ESD event, the buffer circuit 54 should drive the Trigger bus 16 to a voltage level equivalent to the voltage level of the Boost bus 12, local to that trigger circuit. Also contained within power supply pad cell 40 is a PMOSFET 58, which has a gate connected to the Trigger bus 16, a source connected to the Boost bus 12, and a drain connected to the ESD bus 14. In this embodiment, PMOSFET 58 forms an equilibration circuit that functions to electrically short-circuit the ESD bus 14 to the Boost bus 12 both after an ESD event and during normal IC operation, but remains substantially nonconductive during an ESD event.

It is a goal of the ESD protection circuit in FIG. 2 to protect the multiple I/O and power supply pads from positive ESD events coupled to any one of these pads, referenced to grounded $V_{SS}$. Consider an example ESD network simulation where I/O pad 31, in a large bank of pad cells, experiences a positive 3.8A peak current ESD event referenced to grounded $V_{SS}$. Assume that the sizes of diode 33 and clamp NMOSFETs 36 and 46 in each pad cell, and the magnitude of resistor R1 on the ESD bus, are adjusted in the simulation so that the voltage on I/O pad 31 rises to a peak of 8.0V during this ESD event. The primary intended ESD current dissipation path for this ESD event coupled onto I/O pad 31 is through the forward biased diode 33 to the ESD bus, and then along the ESD bus in both directions to the network of clamp NMOSFETs clustered in proximity to the stressed I/O pad. As described earlier, there will be two unavoidable sources of voltage drops between the stressed I/O pad and the drain terminals of clamp NMOSFETs 36 and 46. First is the combined voltage drops of approximately 3V across the diode 33 and its resistive interconnections to the I/O pad and the ESD bus (not shown in FIG. 2). Second is the IR voltage drops along the ESD bus in both directions away from the stressed I/O pad. The peak simulated ESD bus voltages local to I/O pad cells 22, 21, 20, and the power supply pad cell 40, are 5.0, 4.7V, 4.5V, and 4.3V, respectively. These specific voltages are given by way of example only. As before, the drain terminals of the distributed clamp NMOSFETs are biased to different voltage levels depending on proximity to the stressed I/O pad, with the peak voltage found local to the stressed pad. A key feature of the ESD protection circuit illustrated in FIG. 2 is that the trigger circuit 50 is now coupled to any stressed I/O pad via the Boost bus 12 that is separate from the high current ESD bus 14. Note that during an ESD event, the trigger circuit 50 only drives the distributed clamp NMOSFET gates, and therefore consumes only a very small fraction of the current dissipated via the ESD bus to the multiple clamp NMOSFETs 36 and 46. Very little current is routed onto the Boost bus 12, as compared to the ESD bus 14. It is an advantage of the present invention that very minimal IR voltage drops occur either along the Boost bus from any stressed pad to the trigger circuit 50, or from the trigger circuit to any of the clamp NMOSFETs 36 and 46. For this reason, the voltage level on the clamp NMOSFET gates is largely independent of the proximity of the remote trigger circuit to the stressed I/O pad. This is a significant improvement over prior art circuits. In the embodiment shown in FIG. 2, PMOSFET 34 is used to couple the ESD voltage from the I/O pad to the Boost bus 12. During a positive ESD event applied to I/O pad 31, the control signal connected to the gate of PMOSFET 34 is driven to near $V_{SS}$, allowing PMOSFET 34 to turn on and pull the Boost bus 12 up to or near the full stressed I/O pad voltage. PMOSFET 34 and other similar transistors (not numbered) in the plurality of pad cells 20–22 and 40, combined with the circuitry that controls the gates of these transistors (FIG. 3), function as a plurality of pull-up circuits. A primary intent of the ESD circuit shown in FIG. 2 is to maximize Vgs for the multiple clamp NMOSFETs 36 and 46 in each I/O and power supply pad cell, respectively, in order to minimize the effective on-resistance of these shunting devices. In the ESD network simulation described above, with only minimal degradation along the path, the full voltage on the stressed I/O pad (8.0 volts) is coupled onto the Boost bus 12 via PMOSFET 34, then coupled onto the Trigger bus 16 via trigger circuit 50, to gate each of the distributed clamp NMOSFETs 36 and 46. In the previously described prior art network simulation referencing FIG. 1, the peak Trigger bus voltage was only 4.3 volts. Recall that the on-resistance of a clamp NMOSFET is approximately inversely proportional to $V_{gs}$ under these bias conditions. Therefore, the ESD protection network 9 illustrated in FIG. 2, almost halves the on-resistance of the distributed clamp NMOSFETs. With the gate of each clamp NMOSFET biased to near the highest voltage on the IC, the on-resistance of each clamp NMOSFET is effectively minimized. This helps maximize the distributed rail clamp network performance and minimize the layout area required to implement robust ESD protection circuits. This "boosted" ESD network designed as taught herein provides enhanced ESD protection as compared to the prior art circuit shown in FIG. 1.

A key requirement for effective operation of the boosted ESD network described above is that the distributed clamp NMOSFETs turn on quickly enough to limit the peak voltage at the stressed I/O pad to below the defined voltage threshold for failure for that I/O pad. Therefore the elements in ESD protection network 9 in FIG. 2 which are in the critical path for charging the clamp NMOSFETs 36 and 46 gates, including PMOSFET 34, incremental bus resistors R3 for the Boost bus, elements in trigger circuit 50, and incremental bus resistors R2 for the Trigger bus, must be properly sized to achieve this requirement. It is an advantage of the present invention that, due to the very small currents routed through this critical path during an ESD event, these elements are easily sized to meet this requirement, even for networks containing very large numbers of I/O pads. There are multiple further benefits to this scheme. First, the incremental bus resistors R3 for the Boost bus 12 and R2 for the Trigger bus 16 may be much larger than the associated resistors R1 for the ESD bus 14. Therefore the Boost and Trigger buses need only occupy a small fraction of the layout area in the IC periphery consumed by the ESD bus. Second, even with somewhat resistive incremental bus resistors R3 and R2, there is very little IR voltage drop along these two buses, due to the small currents routed onto these buses during an ESD event. Therefore trigger circuit 50 may be placed a large distance away from the stressed I/O pad, without significantly impacting network performance. Third, due also to the minimal IR voltage drops along the Boost bus 12, large numbers of trigger circuits may be placed in parallel along the Boost bus, without any significant bus voltage contention problems as seen with prior circuits.

In a preferred form, multiple trigger circuits, such as trigger circuit 50, will be distributed along the Boost bus 12 with a frequency ranging from every 5 to 20 I/O pad cells. However, in certain applications, more or less frequent placements may be preferable. In most any case, the maximum allowed distance between adjacent trigger circuits will be much larger than the physical width along the Boost bus of a single I/O pad cell. This maximum distance is set to minimize the slight IR voltage drops and RC delays which may occur along the Boost and Trigger buses, and also to limit how many gates of clamp NMOSFETs 36 and 46 a single trigger circuit must drive.

For the reasons described above, the maximum length of an ESD bus 14 segment is typically greater than the total bus length around the periphery of an IC. Therefore the distributed ESD network 9 illustrated in FIG. 2 may be implemented in a preferred embodiment in which the four buses ring the periphery of the IC, protecting all, or a subset of the I/O and power supply pads in the IC. In alternate embodiments, the Trigger bus 16 may be divided into multiple, separate segments along the ESD bus 14 and Boost bus 12. For example, the full network of distributed clamp NMOSFETs 36 and 46 may be partitioned into multiple smaller networks so that each smaller network of clamp NMOSFETs is gated by a single Trigger bus segment. A single Trigger bus segment must couple at least one trigger circuit 50 to at least one clamp NMOSFET 36 or 46.

With the configuration as illustrated in FIG. 2, ESD network design and physical layout is greatly simplified. In one embodiment, all the ESD elements within I/O pad cell 22 may be arranged in a first layout cell and this cell placed in all the functional I/O pad cells on the IC. Likewise, all the ESD elements in power supply pad cell 40 may be arranged in a second layout cell and this cell placed in all the functional power supply pad cells on the IC. Therefore this network is very modular, with only a few elements repeated numerous times. Note that by placing trigger circuits 50 in each power supply pad cell 40 as shown in FIG. 2, the frequency of placement requirement for trigger circuits should be met, since in most IC designs, power supply pads must be this frequently placed. Therefore, in most cases, simply placing the pad cells as needed for normal circuit operation, will guarantee a robust, correctly implemented ESD protection network. This makes the ESD network 9 of FIG. 2 very simple to implement and much less prone to design and layout errors than prior art circuits.

In one example of ESD network 9, the diode 33 is formed as a P+ active in an NWELL diode, with a P+ active perimeter of 400 microns. Actual dimensions are provided by way of example only and may vary significantly depending upon the specific application. The diode 32 is formed as a N+ active in P-substrate diode, with a N+ active perimeter of 400 microns. PMOSFET 34 has a channel width of 60 microns and a channel length of 0.45 microns. NMOSFET 36 has a channel width of 180 microns and a channel length of 0.45 microns. The incremental ESD bus resistance R1 is assumed to be about 0.25 ohms. The corresponding incremental Trigger bus resistance R2 is assumed to be about 15 ohms, and the corresponding incremental Boost bus resistance R3 is assumed to be about 5 ohms. The incremental $V_{SS}$ bus resistance (not shown in FIG. 2) is assumed to be about 0.25 ohms. It is an advantage of the present invention that clamp NMOSFET 36 in I/O pad cell 22 may typically be reduced 40–50% in channel width, and therefore layout area, as compared to the prior art circuit described in FIG. 1. This is due to the higher $V_{gs}$ on the clamp NMOSFETs provided by the boosted network described herein.

In the illustrated embodiment of the ESD network 9 as shown in FIG. 2, ESD protection is provided for the power supply pad $V_{DD1}$ in power supply pad cell 40. It is assumed that this pad connects to a separate positive power supply bus, not shown in FIG. 2. Additional power supply pads and pad cells, for example $V_{DD2}$, $V_{DD3}$, similar to power supply pad cell 40, may also be placed in the same ESD network 9. Note that if the ESD bus 14 serves as a positive power supply bus, and connects to a power supply external to the IC, then $V_{DD1}$, $V_{DD2}$ and $V_{DD3}$ may not exceed the ESD bus supply voltage during normal IC operation, to prevent leakage due to forward biasing of diode 43. However, if the ESD bus 14 is not connected to an external power supply, then $V_{DD1}$, $V_{DD2}$ and $V_{DD3}$ may each connect to external power supplies with differing voltage levels. In this configuration, during normal IC operation, the ESD bus 14 will simply rise to a voltage level one diode drop below the highest of $V_{DD1}$, $V_{DD2}$, or $V_{DD3}$, due to forward biasing of diode 43 in the highest voltage power supply pad cell. It should be well understood that although specific functions, such as I/O and power supply, have been assigned to each of the pad cells in FIG. 2, other pad cell functions may be used.

In an alternate embodiment of ESD network 9 in FIG. 2, resistor 52 and capacitor 53 may be flipped about node 56 so that the resistor is coupled to the $V_{SS}$ bus and the capacitor is coupled to the Boost bus. With the RC transient detector configured in this way, the buffer circuit 54 may utilize, for example, an even number of series-connected CMOS inverter stages. Those skilled in the art will recognize that there are multiple additional transient detector circuits than the one shown in FIG. 2 that will effectively serve in this application. The function of the buffer circuit 54 in FIG. 2 is to sense, invert, and amplify the transient detector output signal at node 56. There are many common circuits that may be used to perform these functions. In general, a trigger circuit 50 is required that senses a rapid ESD-induced voltage transient (dV/dt) on any protected I/O or power supply pad and then drives the Trigger bus 16 to or near a voltage level equal to the voltage level of the Boost bus 12, local to that trigger circuit.

It should be pointed out that the voltage threshold detector circuit found in the prior art and described earlier, does not work well in the boosted ESD network described herein. There are three primary reasons why this is the case. First, the actual voltage threshold of these detector circuits is very sensitive to normal semiconductor process variations and the range of operating temperatures for the IC. Voltage thresholds may vary in a range from 2–3 volts due to these factors. Second, there is not enough voltage margin between the minimum detector circuit voltage threshold required to not interfere with normal IC operation, and the defined maximum allowable voltage on a stressed I/O pad during an ESD event. An ESD voltage threshold detector must not turn on during normal circuit operation. For example, an IC with $V_{DD}$=3.3 volts during normal operation, will typically see a post-manufacturing burn-in at $V_{DD}$=5.0 volts or higher. To insure that the detector circuit does not fire during burn-in, and to add additional margin to account for process variation, the voltage threshold of the ESD detector circuit must typically must be set in a range from 7–8 volts. This does not provide adequate margin to protect fragile elements in the I/O pads during an ESD event. Recall that the critical voltage failure threshold during an ESD event for an I/O pad typically varies in a range from 6–10 V. Third, due to small but unavoidable IR voltage drops along the Boost bus 12, voltage threshold detector circuits placed somewhat remote from the stressed I/O pad may not properly detect an ESD event which would cause a locally placed detector circuit to fire. This could cause bus voltage contention problems when multiple trigger circuits are distributed in parallel along the Boost bus. The RC transient detector circuit 51 specifically, and transient detector circuits in general, are much less sensitive, or immune, to the problem areas described above. For these reasons, voltage threshold sensing ESD detector circuits do not work well in these distributed protection networks.

In an alternate embodiment of ESD network 9 in FIG. 2, multiple instances of buffer circuit 54 may be placed in each I/O pad cell to drive the clamp NMOSFET local to that pad cell, such that only the RC transient detector 51 remains in the trigger circuit 50. In a further alternate embodiment, buffer circuit 54 may be divided into portions, with a first portion local to trigger circuit 50, and a second portion local to each I/O pad cell.

In the ESD network 9 illustrated in FIG. 2, the trigger circuit 50 is shown in power supply pad cell 40. In other embodiments this trigger circuit may alternately be placed in I/O pad cells 20-22, in special spacer cells between pad cells, or wherever adequate space is available. In addition to the placement in I/O and power supply pad cells as shown in FIG. 2, the individual clamp NMOSFETs 36 and 46 may also be placed in special spacer cells between pad cells, or wherever space is available. One form is to provide these clamp NMOSFETs frequently and widely distributed along the ESD bus 14.

While the clamp shunting devices 36 and 46 are shown as NMOSFETs, it should be appreciated that alternate shunting devices and shunting circuits could serve this function. For example, a PMOSFET, two or more series NMOSFETs or PMOSFETs, a junction field effect transistor (JFET), a triggered silicon controlled rectifier (pnpn), a Darlington configured bipolar transistor circuit, or any electronically controlled switch could serve this shunting function.

While specific MOSFET devices are illustrated, it should be well understood that ESD network 9 in the integrated circuit may be implemented with other types of transistors formed by other types of semiconductor processes, such as CMOS, bipolar, BiCMOS, SOI and bulk, SiGe, and others.

In operation, the distributed ESD protection network 9 contains a plurality of integrated circuit pad cells and buses required for operation of the network. Any of the plurality of pad cells 20–22 and 40 is subject to receiving an electrostatic discharge voltage and associated current. The circuit operation associated with an ESD event referencing $V_{SS}$ applied at any other pad is analogous to that described above for an ESD event at I/O pad 31. If the ESD event is applied from I/O pad 31 to another pad, such as to the $V_{DD1}$ pad 41 instead of to $V_{SS}$, the ESD network operation and current paths would be the same except that diode 42 would provide a return path from the $V_{SS}$ bus 18 to the grounded $V_{DD1}$ pad 41. Therefore, the network shown in FIG. 2 allows for ESD protection between any two pads in the ESD protection network 9.

The PMOSFET 58 in FIG. 2 forms an equilibration circuit and provides a method to equalize the voltages on the Boost bus 12 and the ESD bus 14 both during normal circuit operation and immediately after an ESD event. It is important, however, that PMOSFET 58 be nonconductive during an ESD event in order that the Boost bus voltage 12 may properly exceed the ESD bus voltage 14. A primary purpose of PMOSFET 58 is to discharge the Boost bus 12 after a first ESD event to reset trigger circuit 50 so that it may correctly respond to a second ESD event. Once a first ESD event is sensed and fully dissipated, the voltage of ESD bus 14 will likely be low, around one volt. However, without PMOSFET 58, there is no comparable dissipation path to $V_{SS}$ for charge on the Boost bus 12. After a first ESD event, the Boost bus 12 would remain charged for a significant period of time. While this remnant charge on the Boost bus 12 would not be a problem for single applied ESD events, it could be a problem if the integrated circuit is subjected to a series of rapid ESD events in short succession. Recall that the trigger circuit 50 is designed to detect an ESD event by sensing a rapid dV/dt transition on the Boost bus 12. If the Boost bus 12 were to remain somewhat elevated after the first ESD event, the smaller resulting dV/dt transition during the initiation of a second ESD event may not be adequate to fire the trigger circuit 50. Therefore, the equilibration circuit (PMOSFET 58) is needed to provide a charge bleed-off path for the Boost bus 12 to $V_{SS}$ via the ESD bus 14, after the ESD event is over. During normal IC operation, the Trigger bus 16 is held to near $V_{SS}$ potential, and PMOSFET 58 will drive the Boost bus 12 to the ESD bus 14 voltage. A second benefit to PMOSFET 58 is provided by the parasitic P+ drain to NWELL diode that exists within PMOSFET 58. During an ESD event on I/O pad 31, for example, this diode (via the ESD bus 14) may assist PMOSFET 34 in elevating the Boost bus 12 potential. It should be understood that PMOSFET 58 is only one of several devices or circuits that may be used to implement these intended functions.

Figure 3:
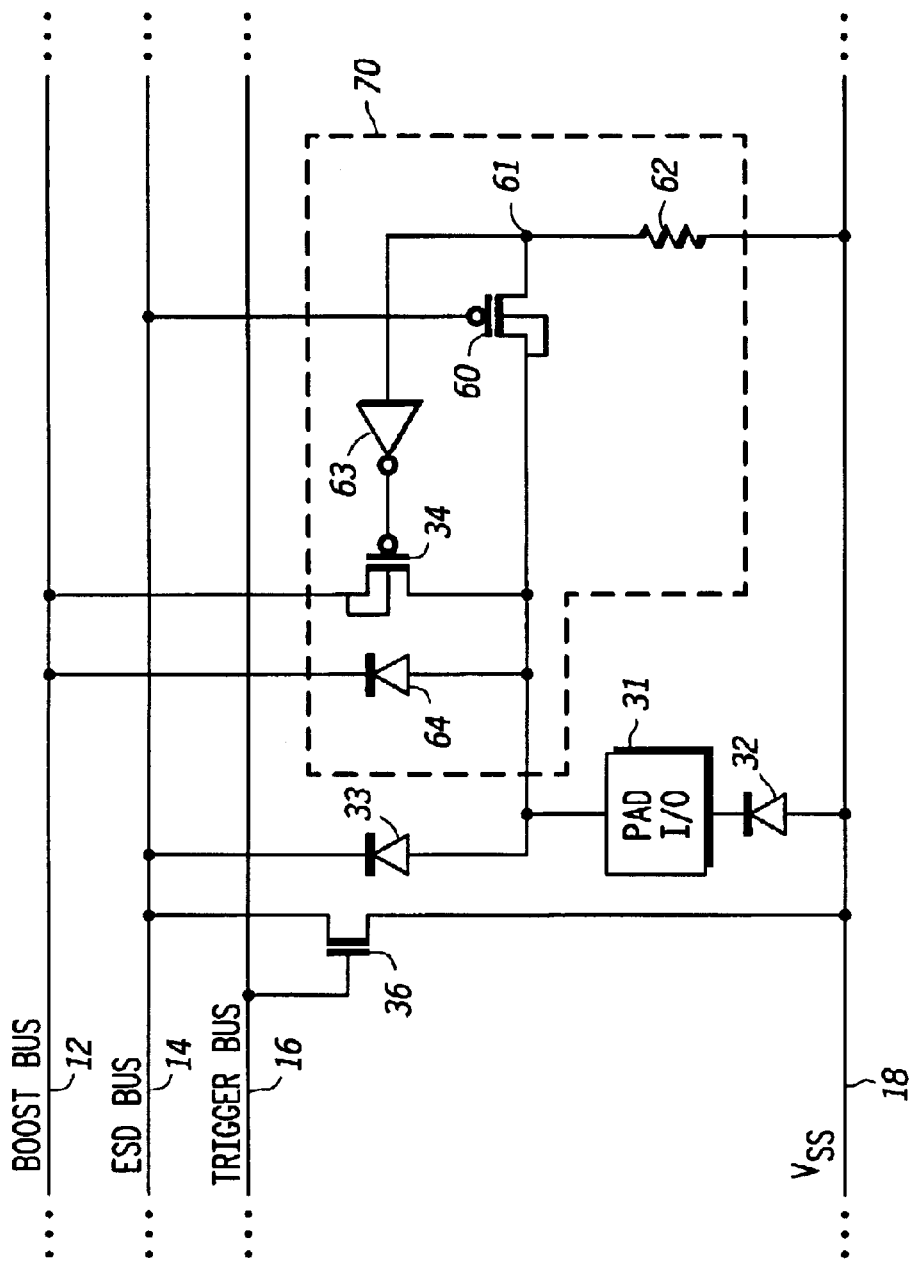
FIG. 3 illustrates in schematic diagram form a control circuit for the ESD clamp circuit of FIG. 2.

Illustrated in FIG. 3 is one example of the ESD elements contained within I/O pad cell 22 including an embodiment of the circuit that controls the gate of PMOSFET 34. In one form, each of the I/O pad cells of FIG. 2 may be implemented as illustrated in FIG. 3 wherein the gates of each of PMOSFETs 34 are similarly controlled. For convenience of illustration, the same elements previously illustrated in FIG. 2 are identically numbered in FIG. 3 such as pad 31, diode 32, clamp NMOSFET 36, diode 33 and PMOSFET 34 as well as Boost bus 12, ESD bus 14, Trigger bus 16 and the $V_{SS}$ bus 18. A PMOSFET 60 has a gate connected to the ESD bus 14, an electrical body connection to its source that is connected to the I/O pad 31, and a drain connected to a first terminal of a resistor 62 at a node 61. A second terminal of resistor 62 is connected to the $V_{SS}$ bus 18. An input of an inverter 63 is connected to node 61 and an output of inverter 63 is connected to the gate of PMOSFET 34. An anode of a diode 64 is connected to the I/O pad 31 and a cathode of diode 64 is connected to the Boost bus 12. In operation, diode 64 could be implemented as a parasitic P+ active to NWELL diode associated with the PMOSFET 34 or may be implemented as a separate, discrete diode.

In this embodiment, PMOSFET 34, diode 64, inverter 63, PMOSFET 60 and resistor 62 comprise a pull-up circuit 70 which elevates the Boost bus voltage to or near the I/O pad 31 voltage when this pad is stressed during an ESD event. This circuit senses a positive ESD event applied to I/O pad 31 and drives the gate of PMOSFET 34 low to make PMOSFET 34 conductive. During an ESD event, when the stressed I/O pad voltage exceeds the local ESD bus 14 voltage by more than a PMOSFET threshold voltage, node 61 is pulled up to near the I/O pad voltage. Resistor 62 is sized to be somewhat resistive so that PMOSFET 60 may easily drive node 61 high. With the input at node 61 assuming a high or active logic state, inverter 63 will drive the gate of PMOSFET 34 low, enabling low resistance source-to-drain conduction in PMOSFET 34. During normal operation, node 61 will be held at $V_{SS}$ by resistor 62, causing inverter 63 to hold the gate of PMOSFET 34 at a voltage level that makes PMOSFET 34 nonconductive. Therefore, pull-up circuit 70 serves to elevate the Boost bus 12 to or near the pad voltage during an ESD event on I/O pad 31.

It should be well understood that many other circuit elements could alternately be used to perform the function of pull-up circuit 70 in FIG. 3. For example, PMOSFET 34 can be replaced by an NMOSFET with appropriate changes to the gate control circuitry. Alternately, PMOSFET 34 can be totally removed and only diode 64 used in a standalone configuration. If a standalone diode 64 is used, there will be an unavoidable diode drop of about 0.7V from the I/O pad to the Boost bus 12, during an ESD event. While this will partially reduce ESD network performance, it has the advantage of simplicity, as the pull-up circuit 70 need only then contain diode 64. Other devices, such as a bipolar transistor, may also be used in lieu of PMOSFET 34.

Figure 1:
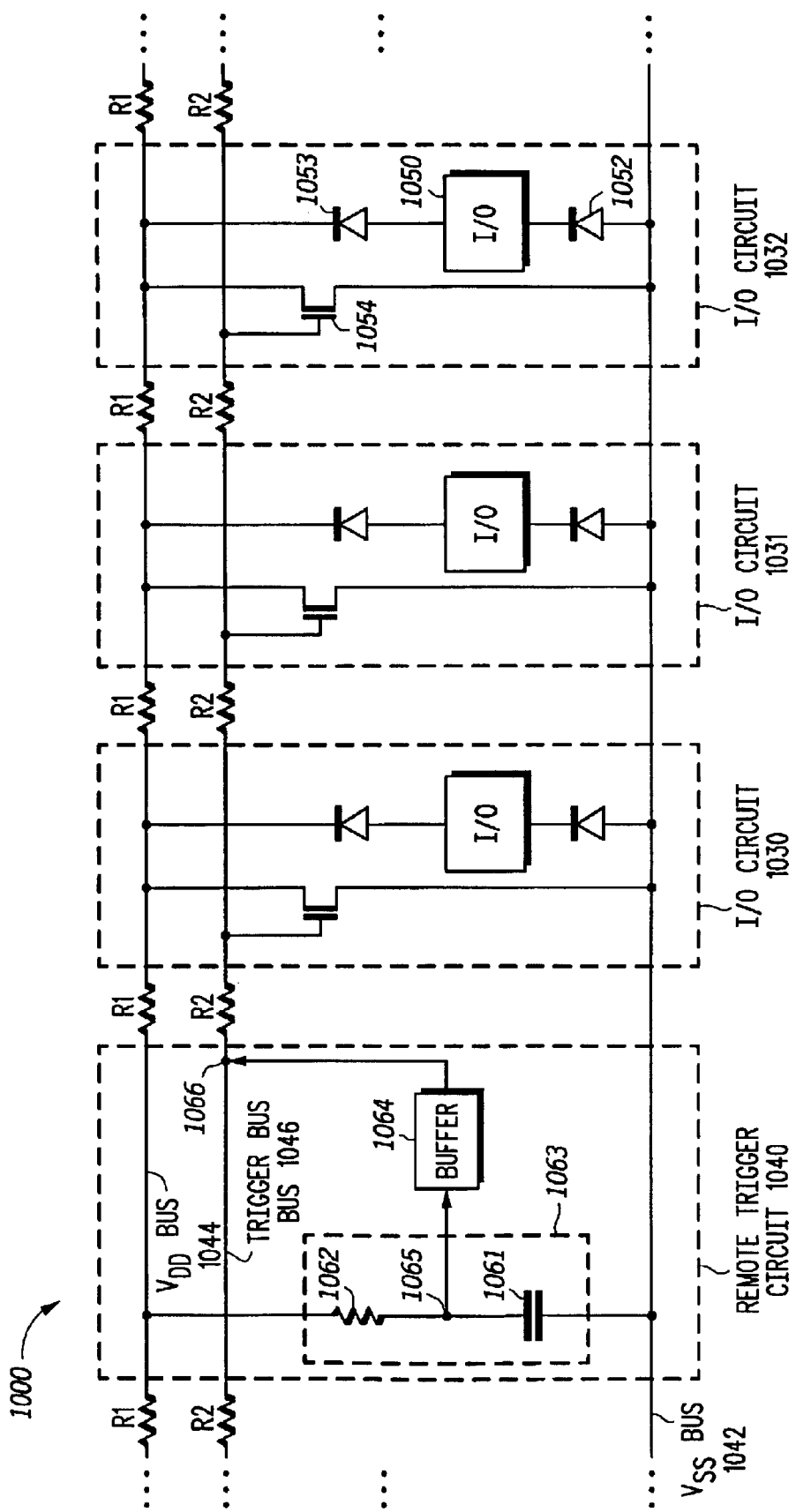
FIG. 1 illustrates in schematic form a prior art ESD protection circuit.

The prior art distributed rail clamp network described in FIG. 1 contains a plurality of individual, discrete rail clamp NMOSFETs placed in each I/O pad cell. As described earlier, this scheme can be a limitation in designs where there are significant gaps between I/O pad cells or where the gap between pad cells can vary considerably around the periphery of the IC. This is due to the fact that the incremental ESD bus resistance R1 is proportional to this spacing. Recall that any variability in R1 between I/O pad cells leads directly to variability in I/O pad ESD performance. To adequately protect I/O pads in the region of the IC periphery where R1 is greatest, the clamp NMOSFET channel width in every I/O pad cell is typically sized based on simulations assuming a network with R1 fixed at the highest value found in the IC periphery. There are multiple problems with this approach. First it is inefficient, since the clamp NMOSFETs are oversized in those regions of the IC periphery where the I/O pad cells are closely spaced. Second, there may be significant variability in ESD performance from one I/O pad to the next. Third, this approach does not work well in an application where one or more pad cells are placed with very large gaps to the neighboring pad cells. In this case the R1 associated with the ESD bus segment spanning these gaps may be too great for distributed clamp networks to be effectively utilized. One approach to reduce each of these problems is to augment the clamp NMOSFETs in the I/O pad cells with additional clamp NMOSFETs placed in spacer cells between I/O pad cells, as described earlier in references to both FIG. 1 and FIG. 2. While it may be effective, this approach typically requires that a large number of unique spacer cells be designed and placed for multiple different spacing between pad cells. Therefore, the embodiments described below provide a more modular ESD design, with fewer unique design elements, where desired.

It is one goal of the present invention to implement an ESD protection network wherein the rail clamp NMOSFETs are physically separated from the I/O pad cells and placed in a substantially continuous and uniformly distributed manner around the IC periphery. As will be described in reference to FIG. 4 and FIG. 5 below, this new ESD network scheme allows for minimum rail clamp NMOSFET channel widths in the region of each I/O pad cell, and minimum variability in ESD performance from one I/O pad to the next, while allowing the maximum flexibility to place I/O pad cells around the IC periphery with any arbitrary spacing.

Figure 4:
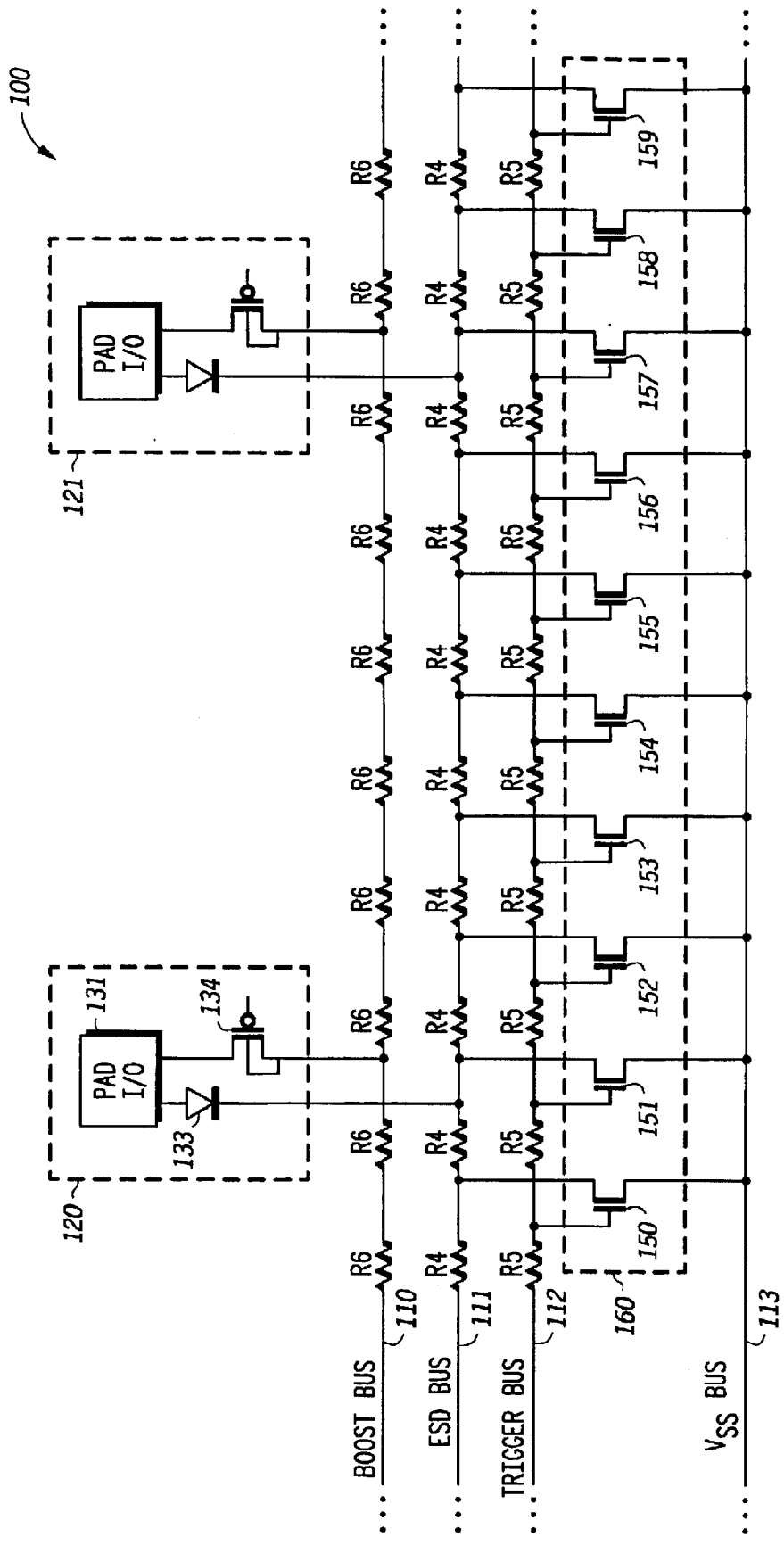
FIG. 4 illustrates in schematic form another embodiment of a distributed and boosted ESD protection network in accordance with the present invention.

Illustrated in FIG. 4 is a portion of an ESD network 100 for protecting a plurality of I/O and power supply pad cells in an IC. I/O pad cells 120 and 121 are shown. A Boost bus 110, an ESD bus 111, a Trigger bus 112 and a $V_{SS}$ bus 113 are provided as in the similar ESD protection network 9 of FIG. 2. A network 160 of clamp NMOSFETs 150–159 is distributed along the length of the ESD bus 111. Each clamp NMOSFET 150–159 has a drain connected to the ESD bus 111, a source connected to the $V_{SS}$ bus 113, and a gate connected to the Trigger bus 112. Note that the clamp NMOSFETs 150–159 are not associated with I/O pad cells 120 and 121, and are instead grouped together in a separate distributed clamp NMOSFET network 160.

A series of incremental bus resistors R4 is shown along the ESD bus 111 between each of the clamp NMOSFETs 150–159. A similar series of incremental bus resistors R5 and R6 is shown along the Trigger bus 112 and the Boost bus 110, respectively. Each resistor (R4, R5, and R6) represents the effective distributed parasitic metal resistance for that segment of the corresponding bus between two adjacent clamp NMOSFETs 150–159. The bus length from the physical center of one such clamp NMOSFET to the physical center of the adjacent clamp NMOSFET may, for example, be used in making these resistance calculations. Incremental bus resistors may also be shown on the $V_{SS}$ bus, but are not included in FIG. 4 in order to clarify the schematic.

The Boost bus 110, ESD bus 111, Trigger bus 112 and $V_{SS}$ bus 113 may extend along the periphery of the IC expanding the ESD protection network 100, including the rail clamp NMOSFET network 160 as shown by the dots in FIG. 4, to include additional pad cells (not shown) which may be provided along the periphery of the IC. In a preferred embodiment, the four buses should be continuous around the integrated circuit periphery or the periphery of a semiconductor die, protecting most or all of the pads in the IC or die. In the event the ESD bus 111 is broken at any point, then large, discrete rail clamp NMOSFETs are required at or near the ends of the bus to properly protect I/O pad cells placed near the end of the bus.

I/O pad cell 120 in FIG. 4 includes an external connection pad 131, a diode 132 (not shown in FIG. 4 but shown in FIG. 5), a diode 133, and a PMOSFET 134. Diode 132, which is not shown in FIG. 4 for clarity, has an anode terminal connected to the $V_{SS}$ bus and a cathode terminal connected to the I/O pad 131. Diode 133 has an anode terminal connected to the I/O pad 131 and a cathode terminal connected to the ESD bus 111. PMOSFET 134 has a drain connected to the I/O pad and a source connected to the Boost bus 110. The gate of PMOSFET 134 is coupled to a control signal as described in connection with FIG. 3. Note that there is no clamp NMOSFET specific to I/O pad cell 120. Not shown in I/O pad cell 120, but typically found in such pad cells are the PMOSFET and NMOSFET output drivers, the pre-driver circuitry for these output drivers, the input circuitry, and other circuit components required for normal I/O operation. I/O pad cell 121 is similar to I/O pad cell 120. In this embodiment, it includes the same circuitry as found in I/O pad cell 120, as shown in FIG. 4.

Not shown in FIG. 4, but required for proper operation of ESD network 100 is one or more trigger circuits analogous to trigger circuit 50 in FIG. 2. These trigger circuits may be placed optionally in I/O pad cells 120–121, in power supply pad cells, in special spacer cells between pad cells, or wherever adequate space is available. An optional equalization circuit (not shown), analogous to PMOSFET 58 of FIG. 2, may be connected between Boost bus 110 and the ESD bus 111 and gated by the Trigger bus 112, for maintaining the Boost bus 110 and the ESD bus 111 at related potentials during normal circuit operation and after an ESD event.

A key feature of the ESD network 100 illustrated in FIG. 4 is the clamp NMOSFET network 160, which is implemented separate from the I/O pad cells 120–121, and which comprises an array of individual clamp NMOSFETs 150–159 distributed in a somewhat continuous and uniform manner along the IC periphery. There are two important requirements for the most efficient possible implementation of clamp NMOSFET network 160. The first requirement is that the network 160 be placed with an essentially constant clamp NMOSFET channel width per unit length of ESD bus 111, over the region of the IC periphery served by ESD network 100. The only exception to this requirement, as discussed earlier, is at the ends of an ESD bus segment, where large, discrete clamp NMOSFETs are typically needed to properly terminate the distributed rail clamp network. The second important requirement for the clamp NMOSFET network 160 is that there be no significant gaps along the IC periphery between individual clamp NMOSFETs 150–159. A clamp NMOSFET network 160 which meets the two requirements of constant clamp NMOSFET width per unit length of ESD bus, and has no gaps between individual clamp NMOSFETs 150–159, over the region of the IC periphery served by ESD network 100, may be defined as a "continuous shunting network." It can be shown that this ideal network provides two very important advantages. First, it insures that the I/O pad ESD performance will be constant, independent of physical placement of the I/O pad cell along the IC periphery. Second, it provides this uniform protection to all pads while utilizing a minimum total combined rail clamp NMOSFET channel width throughout the network. For these reasons, it is the most efficient and compact possible physical implementation of a distributed clamp NMOSFET network 160 for protecting a distributed array of I/O and power supply pads. A further advantage to minimizing the total combined rail clamp NMOSFET channel width is that it also minimizes the off state leakage through the network during normal IC operation.

Figure 5:
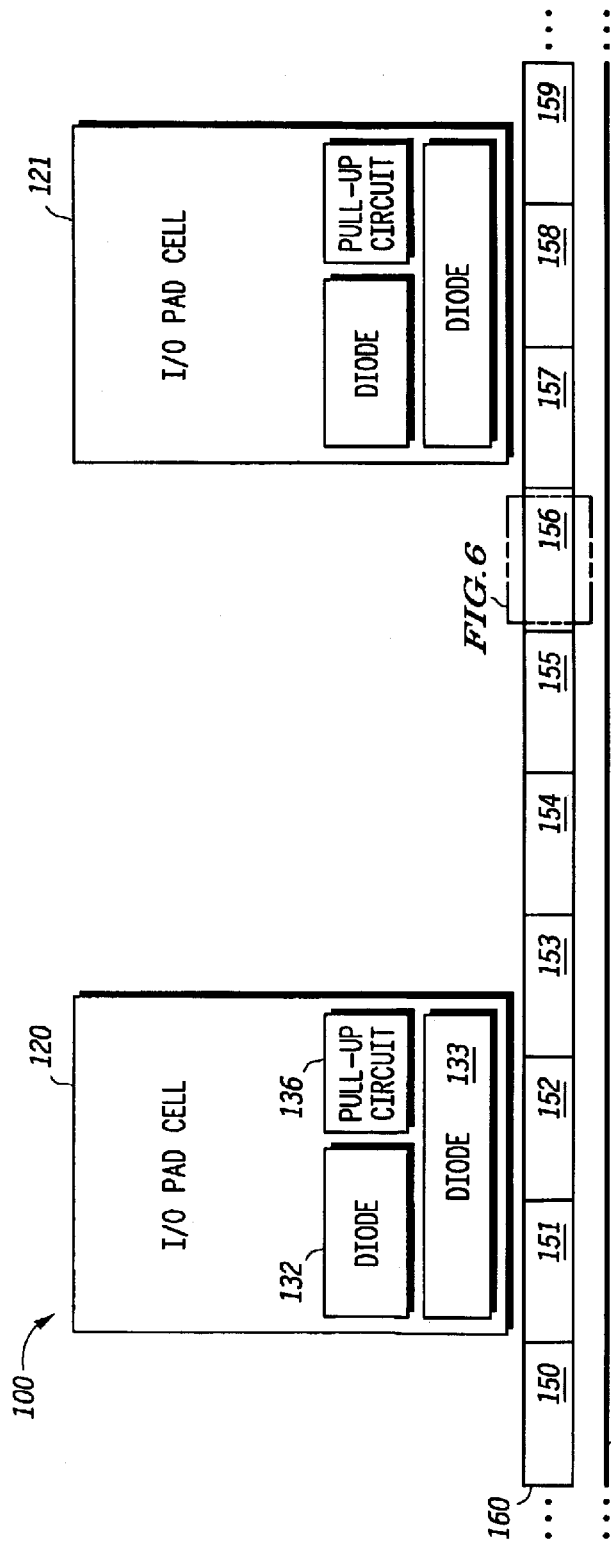
FIG. 5 illustrates in perspective form a layout of the distributed and boosted ESD protection network in accordance with the present invention.

Illustrated in FIG. 5 is a physical layout diagram corresponding to the schematic diagram from FIG. 4. A portion of the ESD network 100, in the integrated circuit, is shown. The continuous clamp NMOSFET network 160, which forms a continuous shunting network, is positioned along an edge 216 of the integrated circuit. In this embodiment, each of clamp NMOSFETs 150–159 is identical, and placed as closely together as the design rules of the process technology allow. I/O pad cells 120 and 121 are placed opposite the IC edge 216 from the clamp NMOSFET network 160. Note that there is a significant physical space or gap between the two I/O pad cells. I/O pad cell 120 includes an external connection pad (not shown), a diode 132, a diode 133 corresponding to FIG. 4, and a pull-up circuit 136. The pull-up circuit 136 is assumed similar to or the same as the pull-up circuit 70 described in reference to FIG. 3, and includes the PMOSFET 134 from FIG. 4. In this embodiment, I/O pad cell 121 is considered identical to I/O pad cell 120. The Boost bus 110, the ESD Bus 111, the Trigger bus 112, and the $V_{SS}$ bus 113 from FIG. 4 are not shown in FIG. 5 for clarity, but in one embodiment, these buses may be routed in one or more layers of metallization over the clamp NMOSFET network 160 and the ESD elements 132, 133, and 136 contained within each I/O pad cell.

Since the clamp NMOSFETs 150–159 are separate from the I/O pad cells, it is a simple matter, for example, to create a single layout cell to represent clamp NMOSFET 150, and then copy this single cell into a linear array of identical abutted instances to form a continuous shunting network (clamp NMOSFET network 160). It can be further explained, with the aid of FIG. 5, that minimizing or eliminating gaps between the individual rail clamp NMOSFETs 150–159 can save layout area in the IC. This is due to the fact that a certain clamp NMOSFET width per unit length of ESD bus 111 is needed to meet a given target I/O pad ESD performance for all the protected I/O and power supply pads. Each of the individual clamp NMOSFETs 150–159 occupies a certain height and width in the IC periphery. As can be seen in FIG. 5, by abutting the individual clamp NMOSFETs 150–159, it is possible to minimize the height of each clamp NMOSFET 150–159, to meet the target clamp NMOSFET width per unit length of ESD bus. If there were gaps between clamp NMOSFETs 150–159, then each clamp NMOSFET would have to be taller, displacing I/O pads 120 and 121 further from the IC edge 216. This can only add to the total IC area. By designing the clamp NMOSFET 150–159 with a constant height, and placing them in an abutted manner as shown in FIG. 5, it is possible to achieve the ESD protection network 100 in a minimum possible layout area. Note that the distributed clamp NMOSFET network 160 layout configuration illustrated in FIG. 5 will work equally well for large banks of minimally spaced I/O pad cells, as well as widely spaced I/O pad cells.

An advantage of the ESD protection network 100 in FIG. 4 and FIG. 5 over the circuit in FIG. 2, is that banks of I/O pad cells to the right and left of any stressed pad are not needed to insure robust ESD performance. In ESD protection network 100, the clamp NMOSFET network 160 is implemented separate from the I/O pad cells. Therefore, even if only a single I/O pad cell is placed along that portion of the ESD bus 111, that I/O pad will exhibit robust ESD performance. It is a further advantage that the I/O designer is given maximum flexibility to place pad cells at any point in the IC periphery with any arbitrary pad cell to pad cell spacing. Diodes 132 and 133, and pull-up circuit 136, may tap onto the ESD bus, Boost bus, and $V_{SS}$ bus, as well as the distributed rail clamp NMOSFET network 160 at any point along the IC periphery. In this continuous shunting network, the resulting I/O pad ESD performance will be constant, independent of physical placement of the I/O pad cell. These are significant advantages over the prior art.

A further advantage of the ESD protection network 100 over prior art network designs is simplified ESD design within each I/O pad cell. With only diodes 132 and 133, and pull-up circuit 136, to place in each I/O pad cell, it is easier to generate libraries of I/O pad cells with multiple functional configurations, physical aspect ratios, metallization schemes, etc. In addition, it may be convenient to create multiple clamp NMOSFET network 160 designs for different metallization schemes, target ESD performance, etc. With these library elements available, the optimum I/O and clamp NMOSFET network cells may be independently chosen for any IC application. This can greatly simplify ESD network design.

It should be understood that the layout of FIG. 5 is exemplary only as numerous modifications could be made. For example, the rail clamp NMOSFET network 160 may be moved to a location opposite the I/O pad cells from the IC edge 216. Many other physical arrangements of the rail clamp NMOSFET network 160, the I/O pad cells, or the ESD elements within the I/O pad cells may prove convenient. An important aspect of this embodiment is that the clamp NMOSFET network 160, which is ideally implemented in a narrow band along the IC periphery, is physically separate from the I/O pad cells 120–121, and is formed by an array of individual clamp NMOSFETs 150–159 distributed in a somewhat continuous and uniform manner.

Figure 6:
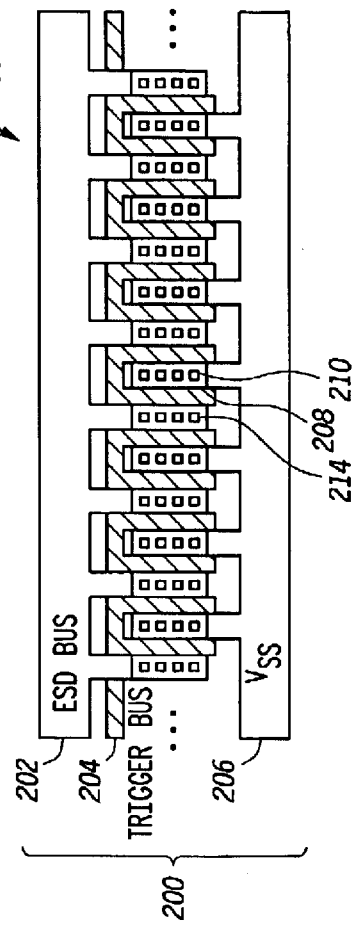
FIG. 6 illustrates in perspective form a layout of the shunting device in accordance with the present invention.

A more detailed example layout of a portion of the clamp NMOSFET 156, from FIG. 5, is shown in FIG. 6. Here it can be seen that clamp NMOSFET 156 is implemented as a plurality of individual NMOSFET segments or fingers wired in parallel. The channel width dimension of each finger is perpendicular to the IC edge 216. Drain, source and gate regions of a single NMOSFET finger within clamp NMOSFET 156 are labeled in FIG. 6. A drain region 214 of this clamp NMOSFET finger is connected to a portion of the metal ESD bus 202. A source region 210 of this clamp NMOSFET finger is connected to a portion of the metal $V_{SS}$ bus 206. Four square contacts to the N+ active are shown in the source and drain regions of each finger. A gate region 208 of this clamp NMOSFET finger is connected to a portion of the Trigger bus 204. The multi-finger clamp NMOSFET 156 is formed from alternating drain and source regions between the gate regions. Clamp NMOSFET 156 may contain additional fingers to the right and left of those drawn, as indicated by the dots in FIG. 6. Clamp NMOSFET 156 may also contain fewer fingers than shown in FIG. 6. In a preferred form of clamp NMOSFET network 160, clamp NMOSFETs 150–159 are identical abutted elements. Therefore the precise number of clamp NMOSFET fingers in each individual clamp NMOSFET 150–159 is not important. In one embodiment, clamp NMOSFETs 150–159 may be merged into a single clamp NMOSFET that encompasses all of clamp NMOSFET network 160. This single device may extend in a narrow band through all or a portion of the region of the IC periphery protected by ESD network 100. For example, in FIG. 5, this merged single device would span a portion of the IC periphery occupied by two I/O pad cells. In one example of clamp NMOSFET network 160, each clamp NMOSFET finger is drawn with a channel width of only 5.0 microns. Therefore the band of single clamp NMOSFET fingers which forms clamp NMOSFET network 160 is quite narrow, and does not consume much layout area. Again, the dimensions provided herein are by way of example only and may be varied. Note that adjustments to the clamp NMOSFET channel width per unit length of ESD bus can be made by simultaneously adjusting the channel width of each individual clamp NMOSFET finger in clamp NMOSFET network 160.

It should be understood that the layout of FIG. 6 is exemplary only as numerous modifications could be made. The actual physical size and placement of the buses that connect to rail clamp NMOSFET 156 may differ significantly from that shown in FIG. 6. In alternate embodiments, clamp NMOSFET 156 may be formed from one or more clamp NMOSFET fingers placed parallel, rather than perpendicular to the IC edge 216.

It is important to note the difference between the distributed rail clamp networks in FIG. 2 and FIG. 4. In the network described in FIG. 2, clamp NMOSFETs are placed in every I/O and power supply pad cell. If there are significant gaps between pad cells then additional rail clamp NMOSFETs may optionally be placed in spacer cells between pad cells. If implemented carefully, this approach can produce a near ideal continuous clamp NMOSFET network. However, a larger number of custom spacer cells must generally be designed to minimize gaps between clamp NMOSFETs in the pad cells. ESD design with this approach may necessitate a large number of additional unique elements. In the network described in FIG. 4, a somewhat continuous and uniformly distributed rail clamp network 160 is formed separate from the I/O and power supply pad cells. This network 160 may easily be formed by a linear abutted array of a single simple rail clamp NMOSFET unit cell, corresponding, for example, to rail clamp NMOSFET 150 in FIG. 5. This simple approach minimizes design and layout time, network complexity, and opportunities for error.

As described earlier, the continuous shunting network described in reference to FIG. 4 and FIG. 5 is the most efficient possible configuration for a distributed ESD network that must equally protect a plurality of I/O and power supply pads. It is most efficient both in terms of the total combined clamp NMOSFET channel width needed throughout the network, and in terms of layout area required to implement this total network. It should be noted that occasionally locally increasing the clamp NMOSFET channel width per unit length of ESD bus, or adding occasional gaps between clamp NMOSFET cells would not improve the overall ESD performance. This is due to the fact that ESD performance in an IC is typically limited by the test results from the weakest pad. A few, more ESD robust pads do not affect the recorded overall performance. Similarly, these changes would not reduce, and may increase the layout area required to implement a complete, robust ESD network. In summary, this embodiment of the present invention provides a simple and efficient ESD protection network and physical layout configuration wherein the rail clamp NMOSFETs are separated from the I/O pad cells and placed in a substantially continuous and uniformly distributed manner around the IC periphery.

By now it should be appreciated that there has been provided an ESD architecture and method that may be used for pad cell protection for all types of circuits. The protection scheme is modular and may be designed as a uniform ESD design cell or block that may be placed without special considerations or design requirements. The ESD protection circuits described herein are scalable to smaller processing geometries.

Because the apparatus implementing the present invention is, for the most part, composed of electronic components and circuits known to those skilled in the art, circuit details have not been explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below. For example, the transistors described herein may be implemented in any processing technology. For the MOS transistors illustrated, changing the conductivity type and the associated signaling logic are changes that are readily apparent. In certain situations, parasitic diodes that exist naturally may be used rather than implementing discrete diodes. Also, the physical positioning of the trigger circuits, pull-up circuitry and diodes within and around the pad cells may be varied from that illustrated without the functionality of the circuitry being affected. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

We claim:

1. An integrated circuit having an Electrostatic Discharge (ESD) circuitry comprising:

a plurality of pads, wherein each of the plurality of pads is coupled to a first bus, a second bus, and a third bus;

a plurality of pull-up circuits, wherein each of the plurality of pull-up circuits is coupled to each of the plurality of pads and the third bus;

a plurality of shunting circuits, wherein:
    each of the plurality of pads is coupled to at least one of the plurality of shunting circuits via the first bus;
    the plurality of shunting circuits operate in parallel in response to an ESD event on at least one of the plurality of pads to provide ESD protection for the plurality of pads; and
    at least one of the plurality of shunting circuits is coupled to the first bus, a fourth bus and the second bus; and a trigger circuit comprising a transient detector circuit, said trigger circuit having a first terminal coupled to each of the plurality of pads via the third bus, a second terminal coupled to at least one of the plurality of shunting circuits via the fourth bus, and a third terminal coupled to the second bus.

2. The integrated circuit of claim 1, wherein each of the plurality of shunting circuits comprises a transistor, wherein a control electrode of the transistor is coupled to the fourth bus, a first current electrode of the transistor is coupled to the second bus, and a second current electrode of the transistor is coupled to the first bus.

3. The integrated circuit of claim 2, wherein each of the plurality of transistors is an NMOSFET transistor.

4. The integrated circuit of claim 1, wherein each of the plurality of pull-up circuits further comprises a transistor having a first current electrode coupled to a predetermined one of the plurality of pads and a second current electrode coupled to the third bus.

5. The integrated circuit of claim 1, wherein each of the plurality of pull-up circuits further comprises a diode having an anode coupled to a predetermined one of the plurality of pads and a cathode coupled to the third bus.

6. The integrated circuit of claim 1, wherein the third bus and the first bus are coupled to each other via an equilibration circuit.

7. The integrated circuit of claim 1, wherein the transient detector circuit comprises a Resistor-Capacitor (RC) transient detector.

8. The integrated circuit of claim 1, wherein the plurality of pads comprises at least one Input/Output (I/O) pad.

9. The integrated circuit of claim 1, wherein the plurality of shunting circuits are part of a continuous shunting network around a portion of a periphery of a semiconductor die.

10. The integrated circuit of claim 9, further comprising a plurality of pad cells each comprising one of the plurality of pads and one of the plurality of pull-up circuits; and wherein the plurality of shunting circuits is physically located outside the plurality of pad cells.

11. The integrated circuit of claim 10, wherein the plurality of shunting circuits are formed from a linear array of identical elements.

12. The integrated circuit of claim 9, wherein a single shunting circuit spans a portion of a periphery of a semiconductor die occupied by two or more I/O pad cells.

13. A method for compensating for electrostatic discharge (ESD) in an integrated circuit, the method comprising:

placing a plurality of pads within the integrated circuit;

coupling each of the plurality of pads to a first bus via a respective first diode device;

coupling each of the plurality of pads to a second bus via a respective second diode device;

coupling a transient detector circuit to the second bus and a third bus, the transient detector circuit having an output coupled to a fourth bus;

physically placing a plurality of pull-up circuits each coupled to each of the plurality of pads and the third bus; and placing a plurality of shunting circuits, wherein at least one of the plurality of shunting circuits is coupled to the first bus, the fourth bus and the second bus.

14. The method of claim 13 further comprising:

implementing each of the plurality of shunting circuits as discrete transistors.

15. The method of claim 13, further comprising:

implementing each of the plurality of shunting circuits as a transistor coupled to each of the plurality of pads having a body electrically coupled to a predetermined current electrode thereof and being controlled to be conductive in response to an ESD event at its respective pad to pull up voltage potential of the third bus in response to the ESD event.

16. The method of claim 13, further comprising:

implementing each of the plurality of pull up circuits as a diode having an anode coupled to a predetermined one of the plurality of pads and a cathode coupled to the third bus.

* * * * *